US011120720B2

(12) United States Patent
Li

(10) Patent No.: US 11,120,720 B2
(45) Date of Patent: Sep. 14, 2021

(54) SHIFT REGISTER UNIT AND DRIVING METHOD THEREOF, GATE DRIVER, DISPLAY PANEL AND DISPLAY DEVICE

(71) Applicant: BOE TECHNOLOGY GROUP CO., LTD., Beijing (CN)

(72) Inventor: Quanhu Li, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 32 days.

(21) Appl. No.: 16/649,720

(22) PCT Filed: May 23, 2019

(86) PCT No.: PCT/CN2019/088091
§ 371 (c)(1),
(2) Date: Mar. 23, 2020

(87) PCT Pub. No.: WO2019/223754
PCT Pub. Date: Nov. 28, 2019

(65) Prior Publication Data
US 2020/0258439 A1 Aug. 13, 2020

(30) Foreign Application Priority Data

May 24, 2018 (CN) .................. 201810510507.X

(51) Int. Cl.
*G09G 3/3266* (2016.01)
*G09G 3/36* (2006.01)
(Continued)

(52) U.S. Cl.
CPC ............ *G09G 3/20* (2013.01); *G09G 3/3266* (2013.01); *G09G 3/3677* (2013.01); *G11C 19/28* (2013.01);
(Continued)

(58) Field of Classification Search
CPC .............. G09G 3/3266; G09G 3/3677; G09G 2300/0408; G09G 2310/0286; G11C 19/28
See application file for complete search history.

(56) References Cited

U.S. PATENT DOCUMENTS 9,947,274 B2* 4/2018 Park .................... G11C 19/28
2005/0220263 A1 10/2005 Moon
(Continued)

FOREIGN PATENT DOCUMENTS

CN 1677575 10/2005
CN 101089939 12/2007
(Continued)

OTHER PUBLICATIONS

Office action from Chinese Application No. 201810510507.X dated Nov. 25, 2019.
(Continued)

*Primary Examiner* — Patrick O Neill
(74) *Attorney, Agent, or Firm* — Calfee, Halter & Griswold LLP

(57) ABSTRACT

A shift register unit and a method for driving the same, a gate driver including the same, a display panel and a display device. The shift register unit includes an input terminal, a first voltage terminal, a second voltage terminal, a first clock signal terminal, a second clock signal terminal, an adjustment terminal, an output terminal, a transfer terminal, an input circuit, a first control circuit, and an output circuit. The shift register unit avoids unstableness of the output signal caused by abnormal leakage of charges during the normal output by providing an adjustment signal, and separates the output signal from the transfer signal by means of the output terminal and the transfer terminal, which can reduce the sizes of transistors connected to the output terminal and the transfer terminal, thereby saving the layout area of the shift (Continued)

register unit and decreasing the power consumption thereof at the same time.

20 Claims, 9 Drawing Sheets

(51) Int. Cl.
*G11C 19/28* (2006.01)
*G09G 3/20* (2006.01)

(52) U.S. Cl.
CPC ............... *G09G 2310/0286* (2013.01); *G09G 2310/08* (2013.01)

(56) References Cited

U.S. PATENT DOCUMENTS

| | | |
|---|---|---|
| 2010/0260312 A1 | 10/2010 | Tsai et al. |
| 2016/0064098 A1 | 3/2016 | Han et al. |
| 2016/0351109 A1 | 12/2016 | Han et al. |
| 2016/0372031 A1 | 12/2016 | Li |
| 2018/0130541 A1 | 5/2018 | Li et al. |
| 2018/0174660 A1 | 6/2018 | Li |
| 2018/0357974 A1 | 12/2018 | Zheng |
| 2019/0057637 A1 | 2/2019 | Fan |
| 2020/0258439 A1 | 8/2020 | Li |

FOREIGN PATENT DOCUMENTS

| | | |
|---|---|---|
| CN | 103700357 | 4/2014 |
| CN | 104809979 | 7/2015 |
| CN | 104809985 | 7/2015 |
| CN | 106297697 | 1/2017 |
| CN | 106601176 | 4/2017 |
| CN | 104575396 | 7/2017 |
| CN | 107134247 | 9/2017 |
| CN | 108538238 | 9/2018 |

OTHER PUBLICATIONS

Office action from Chinese Application No. 201810510507.X dated Jun. 15, 2020.
International Search Report from PCT/CN2019/088091 dated Aug. 23, 2019.

* cited by examiner

SHIFT REGISTER UNIT AND DRIVING METHOD THEREOF, GATE DRIVER, DISPLAY PANEL AND DISPLAY DEVICE

CROSS REFERENCE TO RELATED APPLICATIONS

The present application is a 35 U.S.C. 371 national stage application of PCT international Application No. PCT/CN2019/088091, filed on May 23, 2019, which claims the benefit of Chinese Patent Application No. 201810510507.X filed on May 24, 2018, the entire disclosures of which are incorporated herein by reference.

TECHNICAL FIELD

This disclosure relates to generating a gate driving signal, and in particular to a shift register unit and a driving method thereof, a gate driver comprising the shift register unit, a display panel and a display device.

BACKGROUND

An existing gate driver is often designed in the form of Gate Driver on Array (GOA) so as to integrate a switching circuit comprising a thin film transistor (TFT) in the peripheral region to form a gate driving circuit. According to different types of TFTs, the GOA circuits are divided 20 into NMOS shift registers and PMOS shift registers.

Generally speaking, a PMOS shift register has a simple structure, which reserves little process margin for fluctuations of a PMOS process and performance drifts of a PMOS device, and the performance thereof will be seriously affected in case of a great change of the threshold voltage Vth of a PMOS transistor, so a normal operation function of the PMOS device cannot 25 be achieved when the PMOS device suffers a considerable process fluctuation or a serious performance drift change in use, which results in display abnormality of the display device.

SUMMARY

According to a first exemplary embodiment of this disclosure, a shift register unit is provided, comprising: an input terminal, configured to receive an input pulse; a first voltage terminal, configured to be applied with a first voltage; a second voltage terminal, configured to be applied with a second voltage; a first clock signal terminal, configured to receive a first clock signal; a second clock signal terminal, configured to receive a second clock signal; an adjustment terminal, configured to receive an adjustment signal; an output terminal, configured to output an output signal; a transfer terminal, configured to output a transfer signal; an input circuit, configured to: in response to the first clock signal received at the first clock signal terminal being active, bring the input terminal, the adjustment terminal and a first node into conduction with each other, and in response to the first clock signal being inactive, disconnect the input terminal, the adjustment terminal and the first node from each other; a first control circuit, configured to: in response to a potential of a second node being at an active potential, bring the first voltage terminal into conduction with a third node, and in response to the first clock signal received at the first clock signal terminal being active, bring the second voltage terminal into conduction with the third node; an output circuit, configured to: in response to a potential of the second node being at an active potential, bring the second clock signal terminal into conduction with the output terminal and the transfer terminal, and in response to a potential of the third node being at an active potential, bring the first voltage terminal into conduction with the output terminal and the transfer terminal; wherein the first node is in conduction with the second node, wherein the adjustment signal reduces a voltage difference between the adjustment terminal and the first node when the input terminal, the adjustment terminal and the first node are disconnected from each other.

According to some exemplary embodiments, the input circuit comprises: a first transistor, comprising a control electrode connected to the first clock signal terminal, a first electrode connected to the first node, and a second electrode connected to the adjustment terminal; and a second transistor, comprising a control electrode connected to the first clock signal terminal, a first electrode connected to the adjustment terminal, and a second electrode connected to the input terminal.

According to some exemplary embodiments, the first control circuit comprises: a third transistor, comprising a control electrode connected to the first clock signal terminal, a first electrode connected to the third node, and a second electrode connected to the second voltage terminal; and a fourth transistor, comprising a control electrode connected to the second node, a first electrode connected to the third node, and a second electrode connected to the first voltage terminal.

According to some exemplary embodiments, the output circuit comprises: a fifth transistor, comprising a control electrode connected to the second node, a first electrode connected to the transfer terminal, and a second electrode connected to the second clock signal terminal; a sixth transistor, comprising a control electrode connected to the second node, a first electrode connected to the output terminal, and a second electrode connected to the second clock signal terminal; a seventh transistor, comprising a control electrode connected to the third node, a first electrode connected to the first voltage terminal, and a second electrode connected to the output terminal; an eighth transistor, comprising a control electrode connected to the third node, a first electrode connected to the first voltage terminal, and a second electrode connected to the transfer terminal.

According to some exemplary embodiments, the output circuit further comprises: a first capacitor, comprising a first electrode connected to the control electrode of the sixth transistor, and a second electrode connected to the output terminal; and a second capacitor, comprising a first electrode connected to the control electrode of the fifth transistor, and a second electrode connected to the transfer terminal.

According to some exemplary embodiments, the output circuit further comprises: a third capacitor, comprising a first electrode connected to the control electrode of the eighth transistor, and a second electrode connected to the first voltage terminal; and/or a fourth capacitor, comprising a first electrode connected to the control electrode of the seventh transistor, and a second electrode connected to the first voltage terminal.

According to some exemplary embodiments, the shift register unit further comprises a second control circuit, the second control circuit being configured to: in response to a potential of the first node being lower than the second voltage, disconnect the first node from the second node.

According to some exemplary embodiments, the second control circuit comprises an eleventh transistor, and wherein the eleventh transistor comprises a control electrode connected to the second voltage terminal, a first electrode connected to the first node, and a second electrode connected to the second node.

According to some exemplary embodiments, the shift register unit further comprises a first feedback circuit, the first feedback circuit being configured to: in response to the transfer signal of the transfer terminal being at an active potential, bring the output terminal into conduction with the adjustment terminal.

According to some exemplary embodiments, the first feedback circuit comprises a ninth transistor, and wherein the ninth transistor comprises a control electrode connected to the transfer terminal, a first electrode connected to the adjustment terminal, and a second electrode connected to the output terminal.

According to some exemplary embodiments, the shift register unit further comprises a first feedback circuit, the first feedback circuit being configured to: in response to the output signal of the output terminal being at an active potential, bring the transfer terminal into conduction with the adjustment terminal.

According to some exemplary embodiments, the first feedback circuit comprises a ninth transistor, and wherein the ninth transistor comprises a control electrode connected to the output terminal, a first electrode connected to the adjustment terminal, and a second electrode connected to the transfer terminal.

According to some exemplary embodiments, the shift register unit further comprises a second feedback circuit, the second feedback circuit being configured to: in response to a potential of the third node being at an active potential, bring at least one of the output terminal and the transfer terminal into conduction with the first node.

According to some exemplary embodiments, the first feedback circuit comprises a tenth transistor, and wherein the tenth transistor comprises a control electrode connected to the third node, a first electrode connected to at least one of the output terminal and the transfer terminal, and a second electrode connected to the first node.

According to another exemplary embodiment of this disclosure, a gate driver is provided, comprising N cascaded shift register units as described above, N being an integer greater than or equal to 2, wherein the transfer terminal of the (m)th shift register unit of the N shift register units is connected to the input terminal of the (m+1)th shift register unit of the N shift register units, wherein m is an integer and 1≤m<N.

According to yet another exemplary embodiment of this disclosure, a display panel is provided, comprising: a first voltage line, configured to transmit a first voltage line voltage; a second voltage line, configured to transmit a second voltage line voltage; a first clock line, configured to transmit a first clock line clock signal; a second clock line, configured to transmit a second clock line clock signal; and the gate driver as described above, wherein: each first voltage terminal of the N shift register units is connected to the first voltage line, each second voltage terminal of the N shift register units is connected to the second voltage line, the first clock signal terminal of the (2k−1)th shift register unit of the N shift register units is connected to the first clock line, and the second clock signal terminal thereof is connected to the second clock line, and the first clock signal terminal of the (2k)th shift register unit of the N shift register units is connected to the second clock line, and the second clock signal terminal thereof is connected to the first clock line, and wherein k is a positive integer, and 2k≤N.

According to still another exemplary embodiment of this disclosure, a display device is provided, comprising: the display panel as described above; a timing sequence controller, configured to control operations of the display panel, wherein the timing sequence controller is configured to at least supply the first clock line clock signal and the second clock line clock signal respectively to the first clock line and the second clock line, wherein the first clock line clock signal and the second clock line clock signal have a same period and duty cycle, and differ from each other in timing sequence by half a period; a voltage generator, configured to at least supply the first voltage line voltage and the second voltage line voltage respectively to the first voltage line and the second voltage line, wherein the first voltage line voltage is at an active voltage level, and the second voltage line voltage is at an inactive voltage level.

According to some exemplary embodiments, the first clock line clock signal and the second clock line clock signal each have a duty cycle of 50%.

According to a further exemplary embodiment of this disclosure, a method for driving the above shift register unit is provided, comprising: providing the first voltage to the first voltage terminal and providing the second voltage to the second voltage terminal, wherein the first voltage is at an active voltage level and the second voltage is at an inactive voltage level; providing the first clock signal to the first clock signal terminal and providing the second clock signal to the second clock signal terminal, wherein the first clock signal and the second clock signal have a same period and duty cycle, and differ from each other in timing sequence by half a period; and providing the input pulse to the input terminal, a pulse width of the input pulse being synchronized with a duration in which the first clock signal is inactive.

According to some exemplary embodiments, the first clock signal and the second clock signal each have a duty cycle of 50%.

BRIEF DESCRIPTION OF DRAWINGS

Exemplary embodiments of this disclosure will be described in detail with reference to the drawings so as to render better knowledge and understanding of the problem to be solved, the above and other objectives, features and advantages of this disclosure, in which.

DETAILED DESCRIPTION OF EMBODIMENTS

Figure 1:
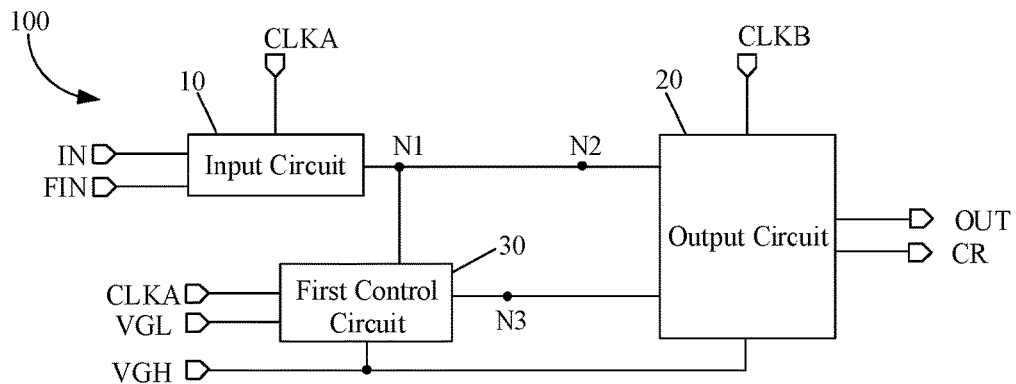
FIG. 1 is a schematic structure view of a shift register unit according to an exemplary embodiment of this disclosure.

The technical solutions in the exemplary embodiments of this disclosure will be described clearly and completely with reference to the drawings. It will be understood that although terms such as "first", "second", "third" and the like can be used herein for describing various elements, parts and/or portions, they should not limit these elements, parts and/or portions. These terms are only used for distinguishing one element, part and/or portion from another element, part or portion. Therefore, a first element, part or portion discussed below may also be referred to as a second or third element, part or portion without departing from the teaching of the present disclosure.

Terms used herein are only intended for describing specified embodiments, rather than limiting the present disclosure. As used herein, singular forms of "one", "a" and "the" are intended to also comprise plural forms, unless explicitly indicated otherwise in the context. It will be further understood that when used in this specification, terms of "comprise" and/or "include" indicate the presence of the indicated features, entities, steps, operations, elements and/or parts, but does not exclude the presence of one or more other features, entities, steps, operations, elements, parts and/or groups thereof or the addition of one or more other features, entities, steps, operations, elements, parts and/or groups thereof. Besides, the term of "and/or" used herein comprises any and all combination(s) of one or more of the items associated and listed.

It will be understood that when an element is referred to as being "connected to another element" or "coupled to another element", the element can be connected to another element or coupled to another element directly or by means of an intermediate element. On the contrary, when an element is described as being "directly connected to another element" or "directly coupled to another element", there is no intermediate element.

Unless otherwise defined, all terms (including both technical terms and scientific terms) used herein have the same meaning as usually understood by one having ordinary skills in the art to which the present disclosure pertains. It will be further understood that terms such as those defined in a commonly used dictionary should be construed as having the same meanings as they do in the related art and/or in the context of this specification, and should not be construed in an ideal sense or an overly formal sense, unless explicitly defined so herein.

It should be noted that in the description of this specification, descriptions with reference to expressions such as "an embodiment", "some embodiments", "an exemplary embodiment", "a specific example" or "some examples" mean that specific features, structures, materials or characteristics described in combination with the embodiment(s) or example(s) are comprised in at least one embodiment or example of this disclosure. Therefore, schematic descriptions of the above expressions are not necessarily directed at the same embodiment(s) or example(s) herein. Moreover, the described specific features, structures, materials or characteristics can be combined in any one or more embodiments or examples in any suitable ways. Besides, where no contradiction is introduced, those skilled in the art can combine and assemble different embodiments or examples described in this specification, and can combine and assemble features of different embodiments or examples described in this specification.

For clarity, some techniques, structures and materials commonly known in the art to which the present disclosure pertains will not be described in detail so as to avoid redundancy and tediousness of the present application.

Referring to FIG. 1, a schematic structure view of a shift register unit 100 according to an exemplary embodiment of this disclosure is shown. The shift register unit 100 comprises: an input terminal IN configured to receive an input pulse; a first voltage terminal VGH configured to be applied with a first voltage; a second voltage terminal VGL configured to be applied with a second voltage; a first clock signal terminal CLKA configured to receive a first clock signal; a second clock signal terminal CLKB configured to receive a second clock signal; an adjustment terminal FIN configured to receive an adjustment signal; an output terminal OUT configured to output an output signal; a transfer terminal CR configured to output a transfer signal. The shift register unit 100 further comprises an input circuit 10, an output circuit 20 and a control circuit 30 indicated by blocks in the drawing.

The input circuit 10 is configured to: in response to the first clock signal received at the first clock signal terminal CLKA being active, bring the input terminal IN, the adjustment terminal FIN and a first node IN into conduction with each other, and in response to the first clock signal CLKA being inactive, disconnect the input terminal IN, the adjustment terminal FIN and the first node N1 from each other. When the input terminal IN, the adjustment terminal FIN and the first node N1 are disconnected from each other, the adjustment signal decreases a voltage difference between the adjustment terminal FIN and the first node N1, thereby preventing abnormal leakage of charges at the first node N1 during normal output of the shift register unit 100.

The first control circuit 30 is configured to: in response to a potential of a second node N2 being at an active potential, bring the first voltage terminal VGH into conduction with a third node N3, and in response to the first clock signal received at the first clock signal terminal CLKA being active, bring the second voltage terminal VGL into conduction with the third node N3. It should be pointed out that in the shift register unit 100, since the first node N1 is in conduction with the second node N2, the first node N1 and the second node N2 have the same potential in the shift register unit 100.

The output circuit 20 is configured to: in response to a potential of the second node N2 being at an active potential, bring the second clock signal terminal CLKB into conduction with the output terminal OUT and the transfer terminal CR, and in response to a potential of the third node N3 being at an active potential, bring the first voltage terminal VGH into conduction with the output terminal OUT and the transfer terminal CR.

It should be noted that the term "active potential" used herein refers to a potential required for enabling the circuit element (e.g., a transistor) involved, and the term "inactive potential" used herein refers to a potential at which the circuit element involved is disabled. For an N-type transistor, the active potential is a high potential, and the inactive potential is a low potential. For a P-type transistor, the active potential is a low potential, and the inactive potential is a high potential. It will be understood that the active potential or the inactive potential is not intended to refer to a certain specific potential, but instead it may comprise a range of potentials. Besides, the term "voltage level" can be exchanged with "potential" in use.

Moreover, it should be further noted that in the shift register unit 100, the source of the adjustment signal received by the adjustment terminal FIN is not necessarily defined, because in some exemplary embodiments of this disclosure, the adjustment terminal FIN may receive an adjustment signal from an external independent signal source as long as the adjustment signal can decrease the voltage difference between the adjustment terminal FIN and the first node N1 when the input terminal IN, the adjustment terminal FIN and the first node N1 are disconnected from each other. Obviously, the adjustment terminal FIN may also receive a signal (including an output signal and/or a transfer signal) outputted from the shift register unit 100 as an adjustment signal.

Figure 2:
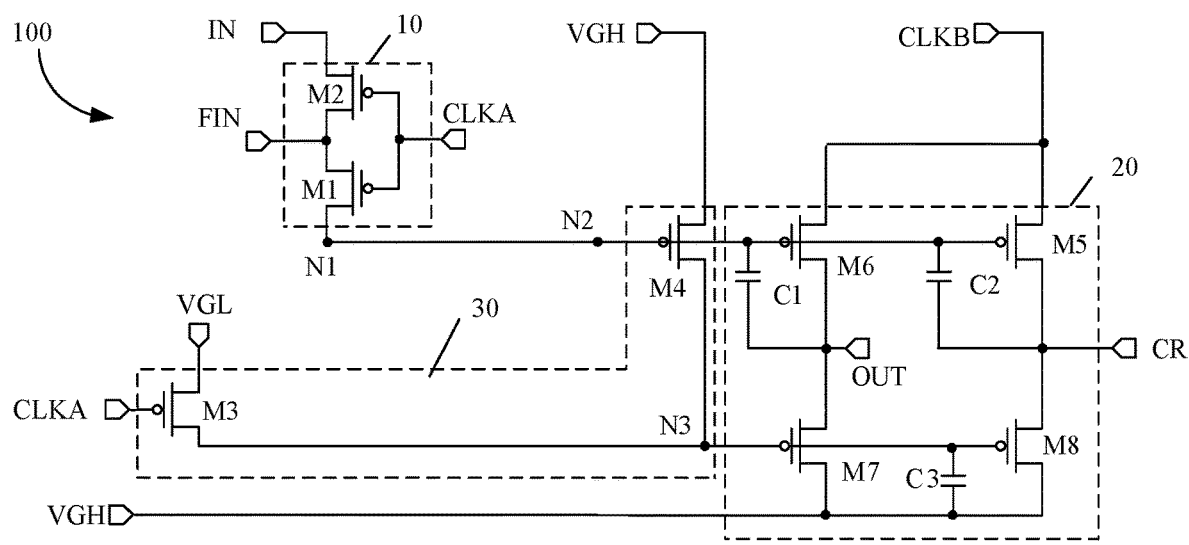
FIG. 2 is an exemplary circuit diagram of the shift register unit of FIG. 1.

Now referring to FIG. 2, an exemplary circuit diagram of the shift register unit 100 of FIG. 1 is shown. The structure of the exemplary circuit of the shift register unit 100 will be described in detail with reference to FIG. 2.

It should be pointed out that the transistors used in each exemplary embodiment of this disclosure can be thin film transistors or field effect transistors or other devices having the same characteristics. In each exemplary embodiment, each transistor is typically fabricated such that its source and drain can be used interchangeably, so its source and drain are not essentially different from each other in the description of the connection relationship. In each exemplary embodiment of this disclosure, to distinguish between the source and the drain of a transistor, one electrode is referred to as a first electrode, and the other is referred to as a second electrode, and the gate is referred to as a control electrode. In the exemplary embodiments of this disclosure, although the transistors are illustrated and described as P-type transistors, N-type transistors are also possible. It can be easily understood that given an N-type transistor, the gate-on voltage has a high potential, and the gate-off voltage has a low potential. The exemplary embodiments of this disclosure are described below by using P-type transistors as an example. However, it can be easily understood that with the teaching of this disclosure, those skilled in the art can replace one or more or all of the P-type transistors in each exemplary embodiment of this disclosure with N-type transistor(s), or add or remove one or more elements into/from each exemplary embodiment of this disclosure, without departing from the spirit and scope of this disclosure. In addition, where no conflict with the teaching of this disclosure is introduced, other embodiments can also be contemplated.

As shown in FIG. 2, the input circuit 10 of the shift register unit 100 comprises a first transistor M1 and a second transistor M2. A control electrode of the first transistor M1 is connected to the first clock signal terminal CLKA, a first electrode thereof is connected to the first node N1, and a second electrode thereof is connected to the adjustment terminal FIN. A control electrode of the second transistor M2 is connected to the first clock signal terminal CLKA, a first electrode thereof is connected to the adjustment terminal FIN, and a second electrode thereof is connected to the input terminal IN. Accordingly, in response to the first clock signal received by the first clock signal terminal CLKA being active, the input terminal IN, the adjustment terminal FIN and the first node IN are brought into conduction with each other, and the input signal is thereby applied to the first node N1.

The first control circuit 30 of the shift register unit 100 comprises a third transistor M3 and a fourth transistor M4. A control electrode of the third transistor M3 is connected to the first clock signal terminal CLKA, a first electrode thereof is connected to the third node N3, and a second electrode thereof is connected to the second voltage terminal VGL. A control electrode of the fourth transistor M4 is connected to the second node N2, a first electrode thereof is connected to the third node N3, and a second electrode thereof is connected to the first voltage terminal VGH. Thereby, the first control circuit 30 brings the first voltage terminal VGH into conduction with the third node N3 in response to the potential of the second node N2 being at an active potential, and brings the second voltage terminal VGL into conduction with the third node N3 in response to the first clock signal received at the first clock signal terminal CLKA being active.

It should be pointed out that the sizes of the third transistor M3 and the fourth transistor M4 are designed to have such an width-to-length ratio (which determines the equivalent on-resistance of the transistor) that the third node N3 is set at an inactive potential when the third transistor M3 and the fourth transistor M4 are both switched on.

The output circuit 20 of the shift register unit 100 comprises a fifth transistor M5, a sixth transistor M6, a seventh transistor M7, an eighth transistor M8, a first capacitor C1, a second capacitor C2 and a third capacitor C3. A control electrode of the fifth transistor M5 is connected to the second node N2, a first electrode thereof is connected to the transfer terminal CR, and a second electrode thereof is connected to the second clock signal terminal CLKB. A control electrode of the sixth transistor M6 is connected to the second node N2, a first electrode thereof is connected to the output terminal OUT, and a second electrode thereof is connected to the second clock signal terminal CLKB. A control electrode of the seventh transistor M7 is connected to the third node N3, a first electrode thereof is connected to the first voltage terminal VGH, and a second electrode thereof is connected to the output terminal OUT. A control electrode of the eighth transistor M8 is connected to the third node N3, a first electrode thereof is connected to the first voltage terminal VGH, and a second electrode thereof is connected to the transfer terminal CR. A first electrode of the first capacitor C1 is connected to the control electrode of the sixth transistor M6, and a second electrode thereof is connected to the output terminal OUT. A first electrode of the second capacitor C2 is connected to the control electrode of the fifth transistor M5, and a second electrode thereof is connected to the transfer terminal CR. A first electrode of the third capacitor C3 is connected to the control electrode of the eighth transistor M8, and a second electrode thereof is connected to the first voltage terminal VGH. Thereby, the output circuit 20 brings the second clock signal terminal CLKB into conduction with both the output terminal OUT and the transfer terminal CR in response to the potential of the first node N1 being at an active potential, and brings the first voltage terminal VGH into conduction with both the output terminal OUT and the transfer terminal CR in response to the potential of the third node N3 being at an active potential.

The presence of the first capacitor C1 and the second capacitor C2 is advantageous, and when the output signal of the output terminal OUT and the transfer signal of the transfer terminal CR change from a high potential to a low potential, the potential at the second node N2 can be further lowered by means of the first capacitor C1 and the second capacitor C2, so that the fifth transistor M5 and the sixth transistor M6 are further switched on, which will be described later. In an exemplary embodiment, the output circuit 20 may also omit at least one of the first capacitor C1 and the second capacitor C2. Besides, the presence of the third capacitor C3 can also be advantageous, because the potential at the third node N3 can be made more stable. In an exemplary embodiment, the output circuit 20 may also omit the third capacitor C3. Besides, a capacitor may also be arranged between the control electrode of the seventh transistor M7 and the first voltage terminal VGH so as to make the potential at the third node N3 more stable.

In the shift register unit 100 and the shift register units to be described in detail below, by separating the output terminal OUT from the transfer terminal CR to generate an output signal and a transfer signal separately, the sizes of the transistors (i.e., the transistors forming the output circuit 20 and the first control circuit 30 as described above) connected to the output terminal OUT can be reduced, which can thus save the layout area of the shift register unit 100 and decrease the power consumption thereof at the same time.

Figure 3:
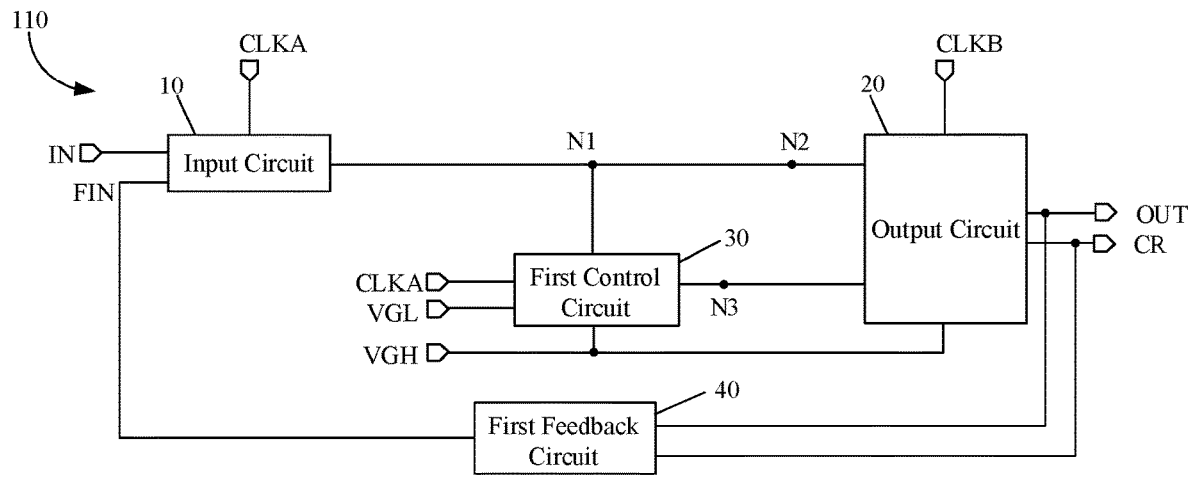
FIG. 3 is a schematic structure view of a shift register unit according to another exemplary embodiment of this disclosure.

FIG. 3 is a schematic structure view of a shift register unit 110 according to another exemplary embodiment of this disclosure. The shift register unit 110 of FIG. 3 differs from the shift register unit 100 of FIG. 1 only in that it further comprises a first feedback circuit 40. Therefore, only the first feedback circuit 40 of the shift register unit 110 will be described below, and the same portions will be omitted for simplicity.

The first feedback circuit 40 receives signal(s) from the output terminal OUT and/or the transfer terminal CR of the shift register unit 110, and transmits the signal(s) to the adjustment terminal FIN. Specifically, in some embodiments, the first feedback circuit 40 is configured to: in response to the transfer signal of the transfer terminal CR being at an active potential, bring the output terminal OUT into conduction with the adjustment terminal FIN. In other embodiments, the first feedback circuit 40 is configured to: in response to the output signal of the output terminal OUT being at an active potential, bring the transfer terminal CR into conduction with the adjustment terminal FIN.

Figure 4:
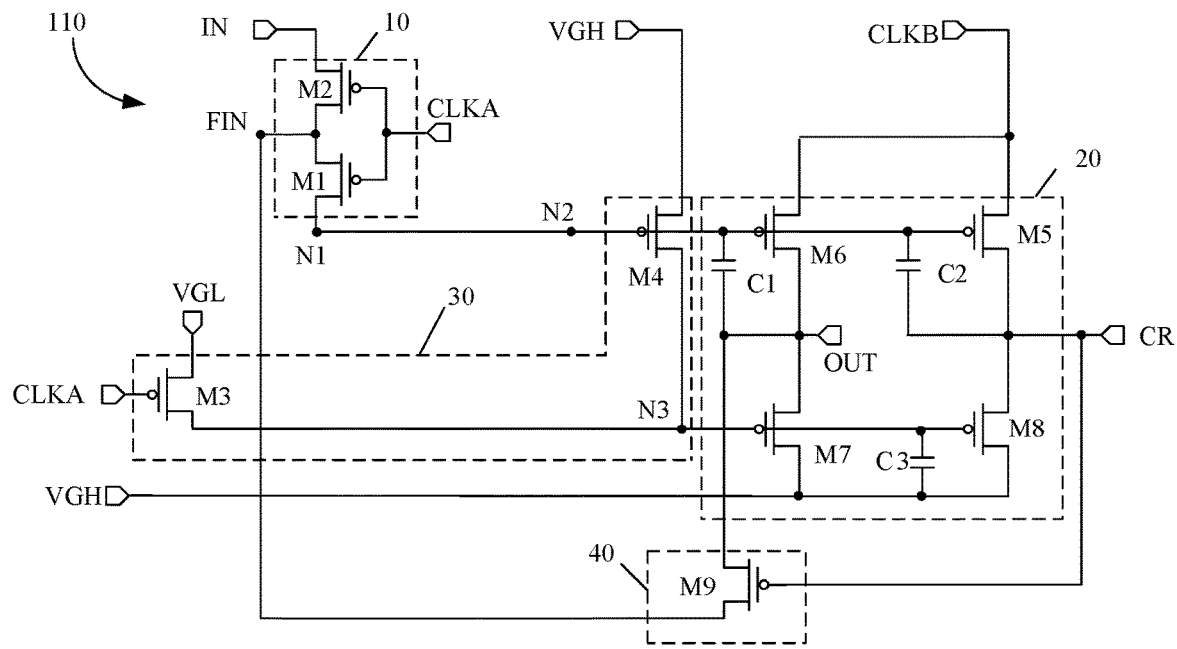
FIG. 4 is an exemplary circuit diagram of the shift register unit of FIG. 3.

FIG. 4 is an exemplary circuit diagram of the shift register unit 110 of FIG. 3. The circuit diagram of the shift register unit 110 of FIG. 4 differs from that of the shift register unit 110 of FIG. 2 only in that it further comprises a first feedback circuit 40. Therefore, only the first feedback circuit 40 of the shift register unit 110 will be described below, and the same portions will be omitted for simplicity.

The first feedback circuit 40 comprises a ninth transistor M9. A control electrode of the ninth transistor M9 is connected to the transfer terminal CR, a first electrode thereof is connected to the adjustment terminal FIN, and a second electrode thereof is connected to the output terminal OUT. Now, the output signal of the output terminal OUT is transmitted to the adjustment terminal FIN as an adjustment signal. It can be easily understood that in further embodiments of this disclosure which are not shown, the control electrode of the ninth transistor M9 may be connected to the output terminal OUT, the first electrode thereof may be connected to the adjustment terminal FIN, and the second electrode thereof may be connected to the transfer terminal CR. Now, the transfer signal of the transfer terminal CR is transmitted to the adjustment terminal FIN as an adjustment signal. By introducing a feedback signal, the potential of the first node N1 can be maintained by the input circuit 10 during the operation of the shift register unit 110, so the following problem can be avoided: the potential of the second node N2 is unstable due to abnormal leakage of charges at the first node N1 during the normal output of the shift register unit 110, which in turn leads to unstableness of the output signal of the shift register unit 110, or even failure of the shift register unit 110.

Figure 5:
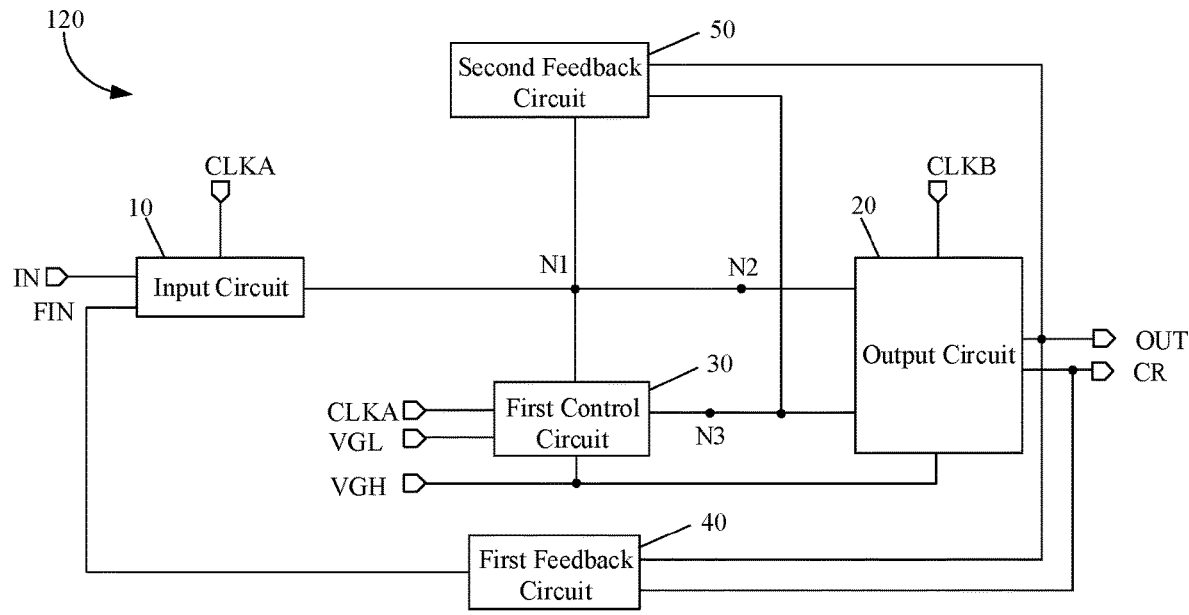
FIG. 5 is a schematic structure view of a shift register unit according to yet another exemplary embodiment of this disclosure.

FIG. 5 is a schematic structure view of a shift register unit 120 according to yet another exemplary embodiment of this disclosure. The shift register unit 120 of FIG. 5 differs from the shift register unit 110 of FIG. 3 only in that it further comprises a second feedback circuit 50. Therefore, only the second feedback circuit 50 of the shift register unit 110 will be described below, and the same portions will be omitted for simplicity.

The second feedback circuit 50 receives signals from the output terminal OUT and/or the transfer terminal CR of the shift register unit 110, and brings at least one of the output terminal OUT and the transfer terminal CR into conduction with the first node N1 in response to a potential of the third node N3 being at an active potential. In the shift register unit 120 of FIG. 5, the second feedback circuit 50 receives signals from the output terminal OUT. However, it can be easily understood that in some embodiments which are not shown, the second feedback circuit 50 may also receive signals from the transfer terminal CR, or from both the output terminal OUT and the transfer terminal CR.

Figure 6:
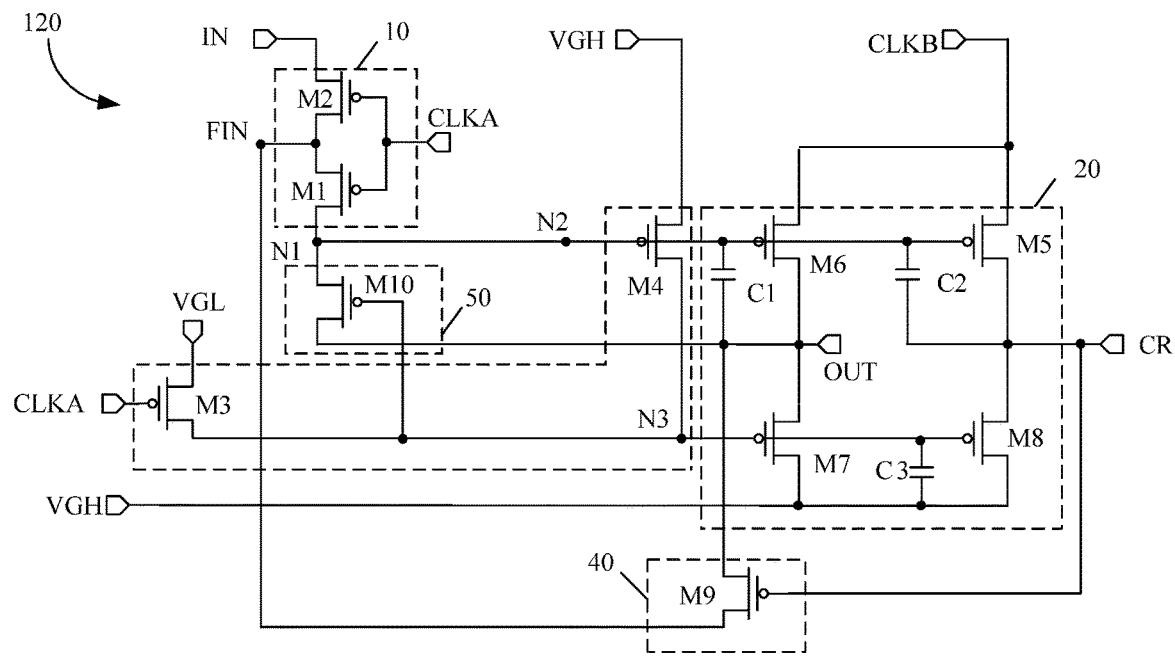
FIG. 6 is an exemplary circuit diagram of the shift register unit of FIG. 5.

FIG. 6 is an exemplary circuit diagram of the shift register unit 120 of FIG. 5. The circuit diagram of the shift register unit 120 of FIG. 6 differs from that of the shift register unit 110 of FIG. 4 only in that it further comprises a second feedback circuit 50. Therefore, only the second feedback circuit 50 of the shift register unit 120 will be described below, and the same portions will be omitted for simplicity.

The second feedback circuit 50 comprises a tenth transistor M10. A control electrode of the tenth transistor M10 is connected to the third node N3, a first electrode thereof is connected to the output terminal OUT, and a second electrode thereof is connected to the first node N1. It can be easily understood that in other embodiments of this disclosure which are not shown, the first electrode of the tenth transistor M10 may also be connected to the transfer terminal CR, or to both the output terminal OUT and the transfer terminal CR.

Figure 7:
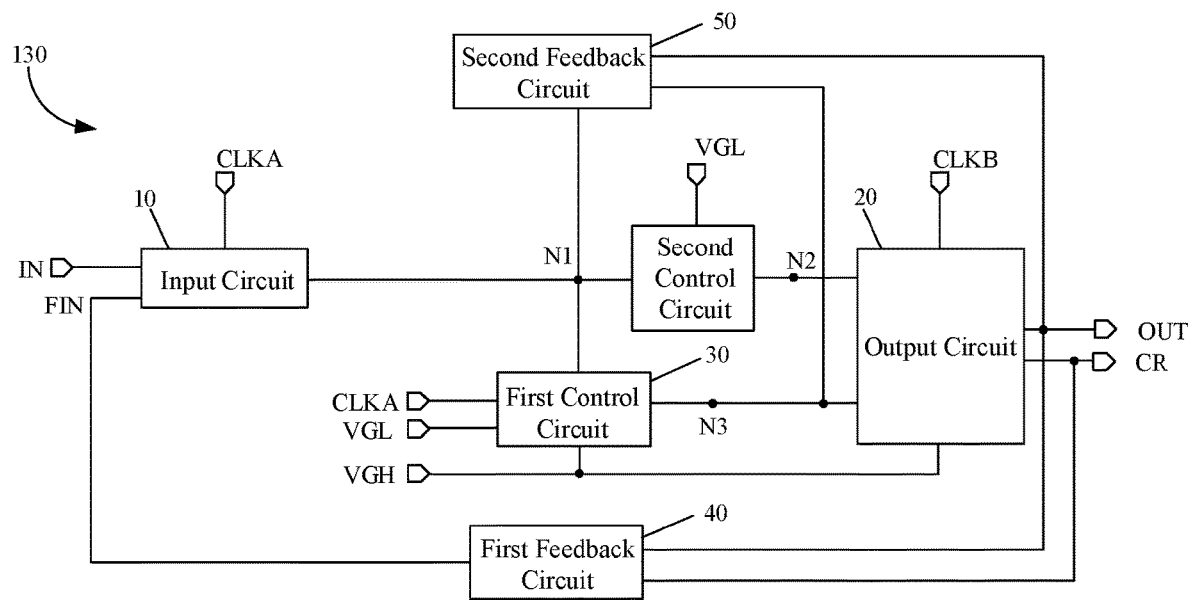
FIG. 7 is a schematic structure view of a shift register unit according to still another exemplary embodiment of this disclosure.

FIG. 7 is a schematic structure view of a shift register unit 130 according to still another exemplary embodiment of this disclosure. The shift register unit 130 of FIG. 7 differs from the shift register unit 120 of FIG. 5 only in that it further comprises a second control circuit 60. Therefore, only the second control circuit 60 of the shift register unit 130 will be described below, and the same portions will be omitted for simplicity.

The second control circuit 60 is arranged between the first node N1 and the second node N2, and configured to: in response to a potential of the first node N1 being lower than a voltage of the second voltage terminal VGL, disconnect the first node N1 from the second node N2. The function of the second control circuit 60 is that when the shift register unit 120 generates an output pulse and when the output signal of the output terminal OUT and the transfer signal of the transfer terminal CR change from a high potential to a low potential, the potentials at the first node N1 and the second node N2 can be further lowered by means of the first capacitor C1 and the second capacitor C2, so that the fifth transistor M5 and the sixth transistor M6 can be further switched on. Now, in order to prevent charge leakage at the first node N1 from affecting the potential at the second node N2 and in turn the switching-on of the fifth transistor M5 and the sixth transistor M6, the second control circuit 60 disconnects the first node N1 from the second node N2, so as to keep the potential at the second node N2 stable, thereby keeping the switching-on of the fifth transistor M5 and the sixth transistor M6 stable.

Figure 8:
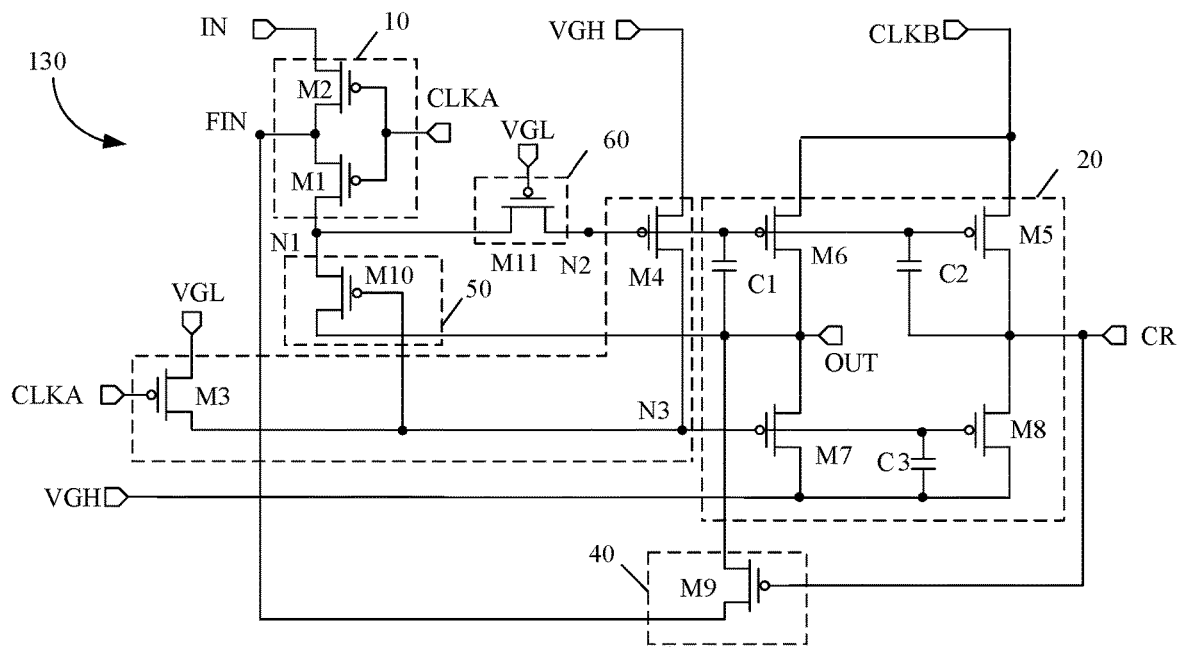
FIG. 8 is an exemplary circuit diagram of the shift register unit of FIG. 7.

FIG. 8 is an exemplary circuit diagram of the shift register unit 130 of FIG. 7. The circuit diagram of the shift register unit 130 of FIG. 8 differs from that of the shift register unit 120 of FIG. 6 only in that it further comprises a second control circuit 60. Therefore, only the second control circuit 60 of the shift register unit 130 will be described below, and the same portions will be omitted for simplicity.

The second control circuit 60 comprises an eleventh transistor M11. A control electrode of the eleventh transistor M11 is connected to the second voltage terminal VGL, a first electrode thereof is connected to the first node N1, and a second electrode thereof is connected to the second node N2. When the output signal of the output terminal OUT and the transfer signal of the transfer terminal CR change from a high potential to a low potential, the potential at the second node N2 can be further lowered by means of the first capacitor C1 and the second capacitor C2, and thus the potential at the first node N1 is also further lowered, becoming lower than the second voltage at the second voltage terminal VGL, thereby making the eleventh transistor M11 be in a cut-off state and disconnecting the first node N1 from the second node N2.

Figure 9:
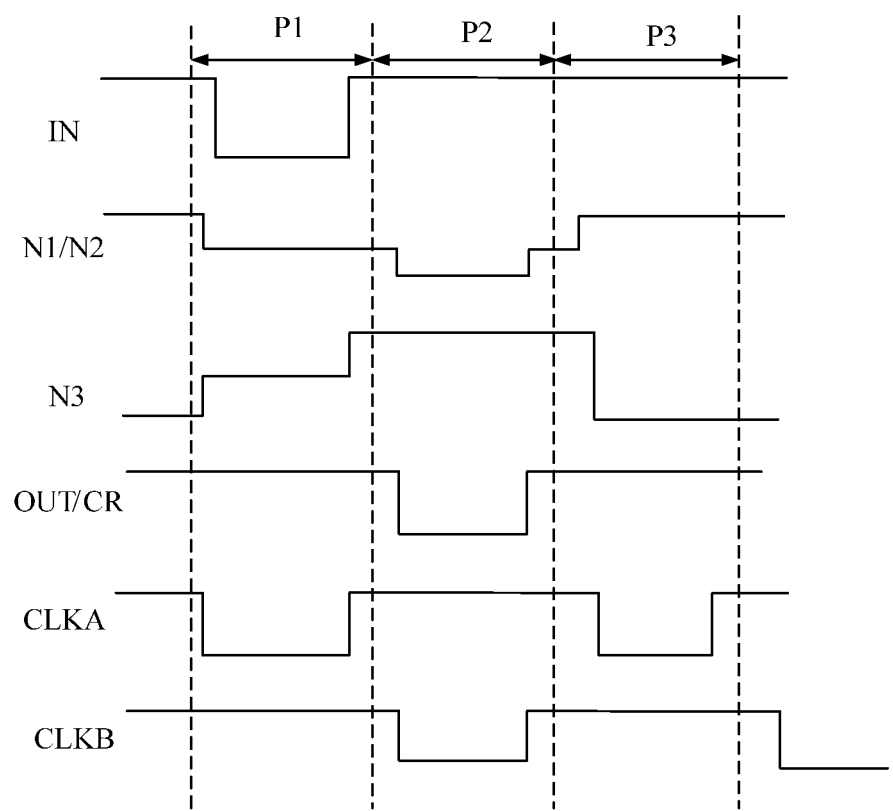
FIG. 9 is a timing sequence diagram of the shift register units of FIGS. 1-6.

Referring to FIG. 9, an exemplary timing sequence diagram of the shift register units of FIGS. 2, 4 and 6 is shown. The operations of the shift register units 100, 110 and 130 of FIGS. 2, 4 and 6 are specifically described based on FIG. 9. A high potential is indicated by 1 and a low potential is indicated by 0 below.

In a first time period P1, IN=0, VGH=1, VGL=0, CLKA=0, CLKB=. Since CLKA=0, the first transistor M1 and the second transistor M2 are switched on, such that the potentials of the first node N1 and the second node N2 are at a low potential (i.e., an active potential). The third transistor M3 is also switched on so as to bring the second voltage terminal VGL into conduction with the third node N3, and meanwhile the fourth transistor M4 is switched on so as to bring the first voltage terminal VGH into conduction with the third node N3. As described above, the sizes of the third transistor M3 and the fourth transistor M4 are designed such that the third node N3 is set at an inactive potential (i.e., a high potential) when the third transistor M3 and the fourth transistor M4 are both switched on. Since the third node N3 is at a high potential, the seventh transistor M7 and the eighth transistor M8 are switched off, and meanwhile since the potential of the second node N2 is at a low potential, the fifth transistor M5 and the sixth transistor M6 are switched on so as to bring the second clock signal terminal CLKB into conduction with both the output terminal OUT and the transfer terminal CR. Now, CLKB=1, so the outputs of the output terminal OUT and the transfer terminal CR are also 1.

Besides, for the shift register units 110 and 120, in the first time period P1, since CR=1, the ninth transistor M9 is switched off. For the shift register unit 120, since the third node N3=1, the tenth transistor M10 is also switched off.

In a second time period P2, IN=1, VGH=1, VGL=0, CLKA=1, CLKB=0. Since CLKA=1, the first transistor M1 and the second transistor M2 are switched off. In this time period, the potentials of the first node N1 and the second node N2 remain at a low potential. Since N2=0, the fourth transistor M4 remains switched on, and since CLKA=1, the third transistor M3 is switched off, which keeps N3=1. Since N3=1, the seventh transistor M7 and the eighth transistor M8 are switched off, and meanwhile since N2=0, the fifth transistor M5 and the sixth transistor M6 are switched on so as to bring the second clock signal terminal CLKB into conduction with both the output terminal OUT and the transfer terminal CR. Now, CLKB=0, so the outputs of the output terminal OUT and the transfer terminal CR are also 0.

For the shift register unit 100, in the second time period P2, the adjustment signal received from the adjustment terminal FIN can also be set at a low potential, so as to reduce a voltage difference between the source and the drain of the first transistor M1, thereby reducing the possibility of charge leakage of the first node N1 through the first transistor M1. For the shift register units 110 and 120, in the second time period P2, since CR=0, the ninth transistor M9 is switched on so as to transmit the output signal of the output terminal OUT to the adjustment terminal FIN as an adjustment signal, and since OUT=0 and the first node N1 and the second node N2 are both at a low potential, the voltage difference between the source and the drain of the first transistor M1 can be reduced, and thereby the possibility of charge leakage of the first node N1 through the first transistor M1 can be reduced. Besides, for the shift register unit 120, in the second time period P2, since the third node N3=1, the tenth transistor M10 remains switched off.

Therefore, in the second time period P2, the shift register units 100, 110 and 120 generate an output pulse.

In a third time period P3, IN=1, VGH=1, VGL=0, CLKA=0, CLKB=1. Since CLKA=0, the first transistor M1 and the second transistor M2 are switched on, but since IN=1, the potentials of the first node N1 and the second node N2 are now at a high potential. The third transistor M3 is switched on and the fourth transistor M4 is switched off, so the third node N3=0. Since N2=1, the fifth transistor M5 and the sixth transistor M6 are switched off, and meanwhile since N3=0, the seventh transistor M7 and the eighth transistor M8 are switched on so as to bring the first voltage terminal VGH into conduction with both the output terminal OUT and the transfer terminal CR. Now, VGH=1, so the outputs of the output terminal OUT and the transfer terminal CR are also 1.

Besides, for the shift register units 110 and 120, in the third time period P3, since CR=1, the ninth transistor M9 is switched off, thereby disconnecting the output terminal OUT from the adjustment terminal FIN. For the shift register unit 120, since the third node N3=0, the tenth transistor M10 is now switched on, so as to transmit the output signal of the output terminal OUT to the first node N1, thereby charging the first node N1 and the second node N2 to keep the potentials of the first node N1 and the second node N2 stable.

Therefore, in the third time period P3, the shift register units 100, 110 and 120 are reset. After that, the shift register units 100, 110 and 120 will keep the potentials of the output signals of the output terminal OUT and the transfer terminal CR unchanged until a next input pulse is received. Upon receipt of the next input pulse, the shift register units 100, 110 and 120 will repeat the operations in the first time period P1, the second time period P2 and the third time period P3.

Figure 10:
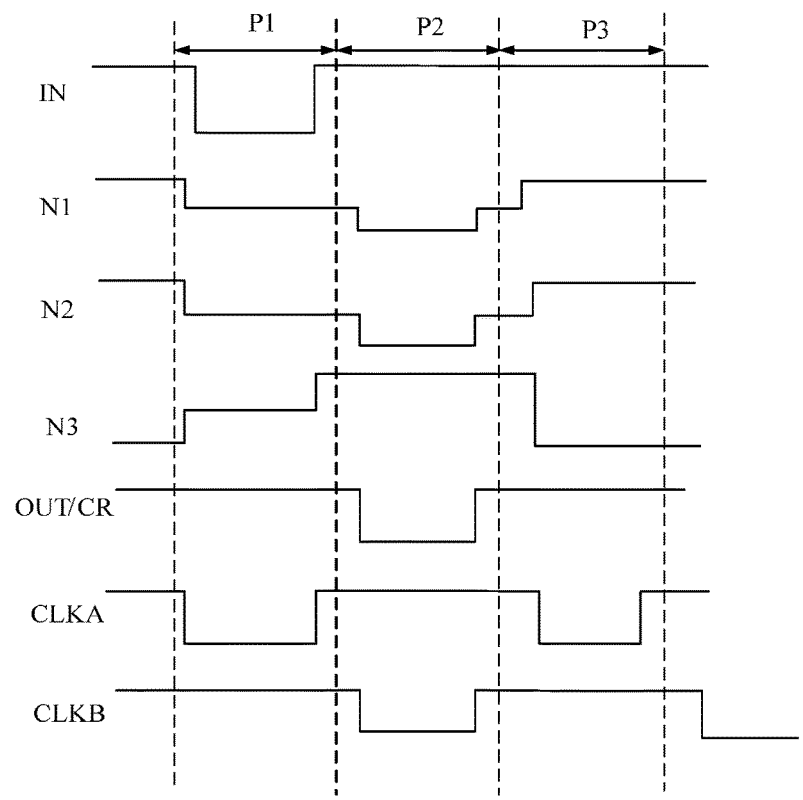
FIG. 10 is a timing sequence diagram of the shift register unit of FIGS. 7-8.

FIG. 10 is an exemplary timing sequence diagram of the shift register unit 130 of FIGS. 7-8.

In a first time period P1, IN=0, VGH=1, VGL=0, CLKA=0, CLKB=1. Since CLKA=0, the first transistor M1 and the second transistor M2 are switched on such that the first node N1 is now at a low potential, and now the eleventh transistor M11 is switched on to bring the first node N1 into conduction with the second node N2, so the second node N2 is also at a low potential. The third transistor M3 is also switched on so as to bring the second voltage terminal VGL into conduction with the third node N3, and meanwhile the fourth transistor M4 is switched on so as to bring the first voltage terminal VGH into conduction with the third node N3. As described above, the sizes of the third transistor M3 and the fourth transistor M4 are designed such that the third node N3 is set at an inactive potential (i.e., a high potential) when the third transistor M3 and the fourth transistor M4 are both switched on. Since the third node N3 is at a high potential, the seventh transistor M7 and the eighth transistor M8 are switched off, and meanwhile since the potential of the second node N2 is at a low potential, the fifth transistor M5 and the sixth transistor M6 are switched on so as to bring the second clock signal terminal CLKB into conduction with both the output terminal OUT and the transfer terminal CR. Now, CLKB=11, so the outputs of the output terminal OUT and the transfer terminal CR are also 1. Besides, since CR=1, the ninth transistor M9 is switched off, and since the third node N3=1, the tenth transistor M10 is switched off.

In a second time period P2, IN=1, VGH=1, VGL=0, CLKA=1, CLKB=0. Since CLKA=1, the first transistor M1 and the second transistor M2 are switched off. In this time period, the potentials of the first node N1 and the second node N2 remain at a low potential. Since N2=0, the fourth transistor M4 remains switched on, and since CLKA=1, the third transistor M3 is switched off, which keeps N3=1. Since the third node N3=1 now, the seventh transistor M7 and the eighth transistor M8 are switched off, and meanwhile since the second node N2=0, the fifth transistor M5 and the sixth transistor M6 are switched on so as to bring the second clock signal terminal CLKB into conduction with both the output terminal OUT and the transfer terminal CR. Now, CLKB=0, so the outputs of the output terminal OUT and the transfer terminal CR are also 0.

It should be noted that in the second time period P2, because of the first capacitor C1 and the second capacitor C2, when the outputs of the output terminal OUT and the transfer terminal CR change from a high potential to a low potential, the potentials at the first node N1 and the second node N2 will become lower, i.e., lower than the second voltage of the second voltage terminal VGL, and as a result, the eleventh transistor M1 is in a cut-off state so as to disconnect the first node N1 from the second node N2, thereby preventing a potential change caused by possible leakage of charges at the first node N1 from affecting the potential of the second node N2. Therefore, as clearly shown in FIG. 10, in the second time period P2, the potential at the second node N2 is lower than the potential at the first node N1.

In addition, similarly, for the shift register unit 130, in the second time period P2, since CR=0, the ninth transistor M9 is switched on so as to transmit the output signal of the output terminal OUT to the adjustment terminal FIN as an adjustment signal, and since OUT=0 and the first node N1 is at a low potential, the voltage difference between the source and the drain of the first transistor M1 can be reduced, and thereby the possibility of charge leakage of the first node N1 through the first transistor M1 can be reduced. Besides, since the third node N3=1, the tenth transistor M10 remains switched off.

Therefore, in the second time period P2, the shift register unit 130 generates an output pulse.

In a third time period P3, IN=1, VGH=1, VGL=0, CLKA=0, CLKB=. Since CLKA=0, the first transistor M1 and the second transistor M2 are switched on, but since IN=1, the potentials of the first node N1 and the second node N2 are at a high potential. The third transistor M3 is switched on and the fourth transistor M4 is switched off, so the third node N3=0 now. Since the second node N2=1, the fifth transistor M5 and the sixth transistor M6 are switched off, and meanwhile since N3=0, the seventh transistor M7 and the eighth transistor M8 are switched on so as to bring the first voltage terminal VGH into conduction with both the output terminal OUT and the transfer terminal CR. Now, VGH=1, so the outputs of the output terminal OUT and the transfer terminal CR are also 1.

Besides, in the third time period P3, since CR=1, the ninth transistor M9 is switched off; and since the third node N3=0, the tenth transistor M10 is now switched on, so as to transmit the output signal of the output terminal OUT to the first node N1, thereby charging the first node N1 and the second node N2 to keep the potentials of the first node N1 and the second node N2 stable.

Therefore, in the third time period P3, the shift register unit 130 is reset. After that, the shift register unit 130 will keep the potentials of the output signals of the output terminal OUT and the transfer terminal CR unchanged until a next input pulse is received. Upon receipt of the next input pulse, the shift register unit 130 will repeat the operations in the first time period P1, the second time period P2 and the third time period P3.

Figure 11:
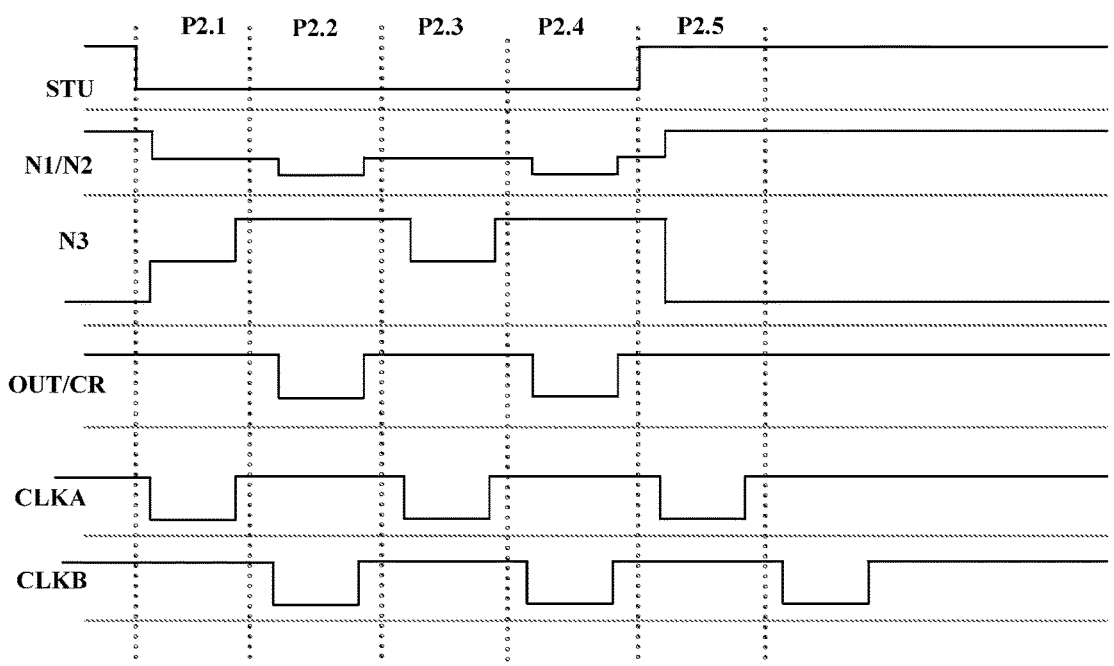
FIG. 11 is another timing sequence diagram of the shift register units of FIGS. 1-6, which shows the generation of multiple output pulses during one scanning process.
Figure 12:
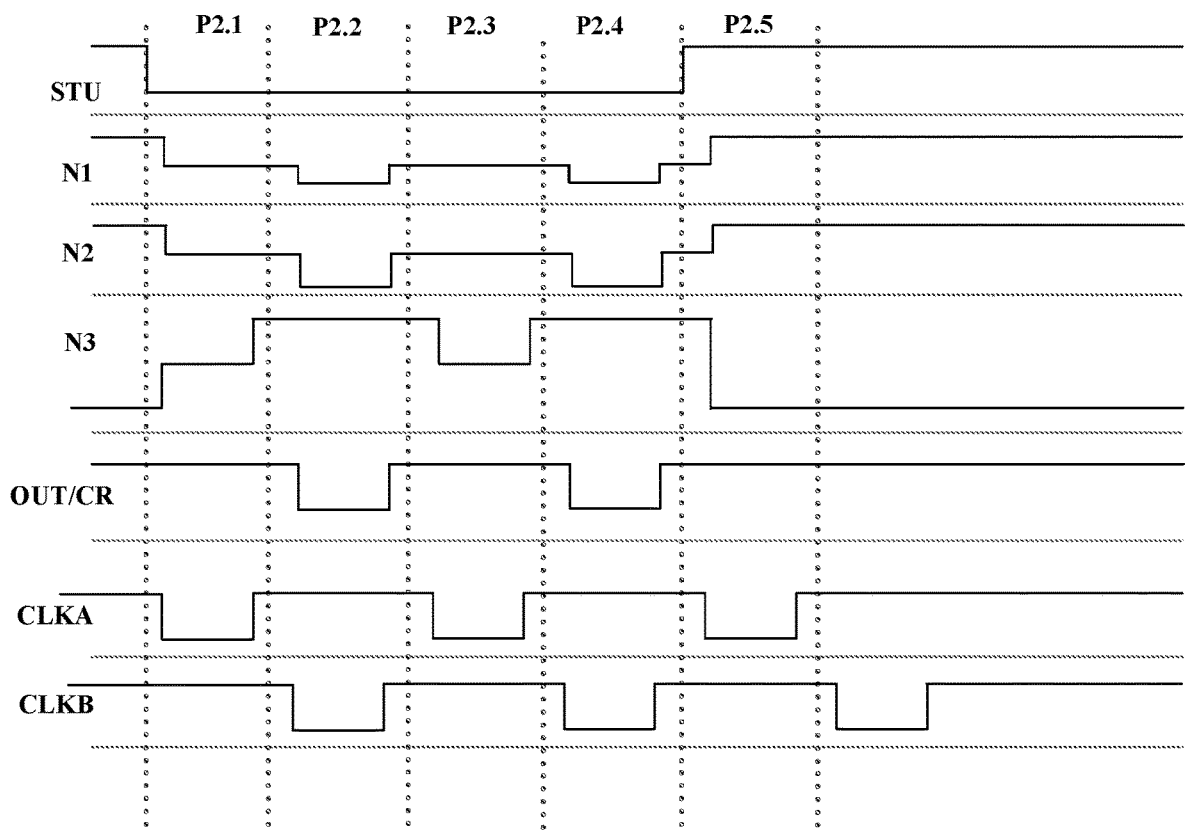
FIG. 12 is another timing sequence diagram of the shift register unit of FIGS. 7-8, which shows the generation of multiple output pulses during one scanning process.

FIG. 11 is another exemplary timing sequence diagram of the shift register units of FIGS. 1 to 6, which shows the generation of multiple output pulses during one scanning process; similarly, FIG. 12 is another exemplary timing sequence diagram of the shift register unit of FIGS. 7-8, which also shows multiple outputs during one scanning process. It should be noted that the operations shown in FIG. 11 and FIG. 12 are carried out when the shift register unit is in a cascaded state, so FIG. 11 and FIG. 12 both show a scan signal STU, and upon receipt of the scan signal STU, the shift register unit (i.e., the shift register unit is the first stage in the cascade) generates two output signal pulses (correspondingly, there can also be two transfer signal pulses), in which the two output signal pulses or the two transfer signal pulses can be then transmitted to a shift register unit at the next stage as input pulses, so as to continue to generate two shifted output signal pulses correspondingly.

In the exemplary timing sequence diagrams shown in FIG. 11 and FIG. 12, in the first time period P2.1 and the second time period P2.2, the operations of the shift register unit are the same as those described above with respect to the first time period P1 and the second time period P2 shown in FIG. 9 and FIG. 10, which will not be repeated for simplicity. In the third time period P2.3 and the fourth time period P2.4, the shift register unit repeats the operations in the first time period P2.1 and the second time period P2.2. In the fifth time period P2.5, the operations of the shift register unit are the same as those described above with respect to the third time period P3 shown in FIG. 9 and FIG. 10. Thus, this disclosure will not make explanations repeatedly for simplicity.

As shown in FIG. 11 and FIG. 12, the shift register unit can generate two output signal pulses in one scanning process. It can be easily understood that the shift register unit according to an exemplary embodiment of this disclosure can generate more output signal pulses in one scanning process upon needs.

Figure 13:
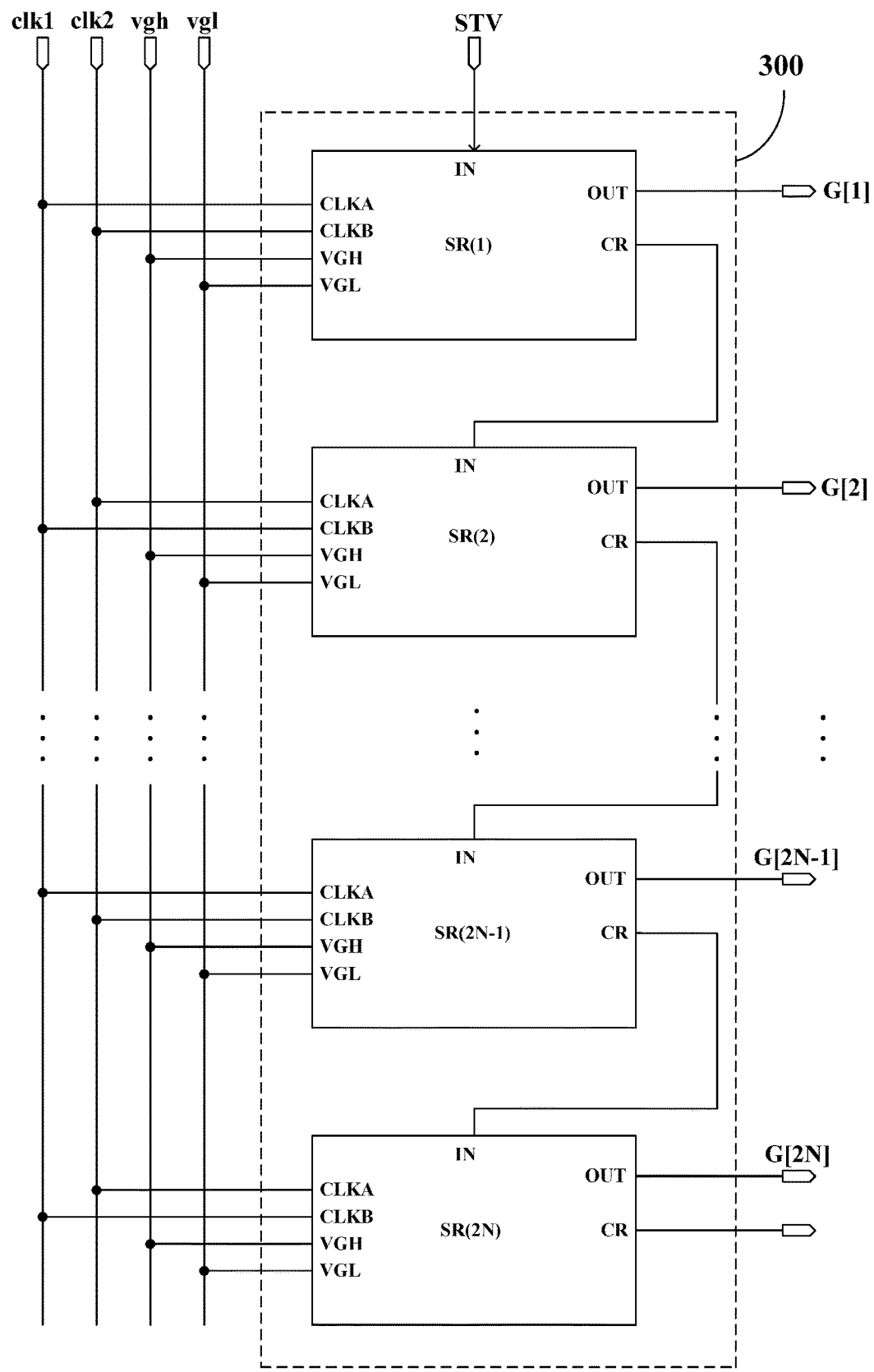
FIG. 13 is a schematic structure view of a gate driver formed by any of the shift register units of FIGS. 1-8 and shows the connection of the gate driver in the display panel.

FIG. 13 is a schematic structure view of a gate driver 300 formed by any of the shift register units of FIGS. 1 to 8 and shows the exemplary connection of the gate drive 300 in a schematic display panel.

As shown in FIG. 13, the gate driver 300 comprises 2N cascaded shift register units SR(1), SR(2), ..., SR(2N−1) and SR(2N), each of which can take the form of any of the shift register units described above in FIG. 1 to FIG. 5. N can be an integer greater than or equal to 1. In the gate driver 300, except for the first shift register unit SR(1), the input terminal IN of each of the shift register units is connected to the transfer terminal CR of a previous shift register unit adjacent thereto.

When the gate driver 300 is disposed in the display panel, the 2N shift register units SR(1), SR(2), ..., SR(2N−1) and SR(2N) in the gate driver 300 can be connected to 2N gate lines G[1], G[2], ..., G[2N−1] and G[2N] correspondingly. Besides, for each of the shift register units SR(1), SR(2), ..., SR(2N−1) and SR(2N), the first voltage terminal VH is connected to a first voltage line vgh, and the second voltage terminal is connected to a second voltage line vgl, wherein the first voltage line vgh is configured to transmit a first voltage line voltage and the second voltage line vgl is configured to transmit a second voltage line voltage. Besides, the first clock signal terminal CLKA of an odd-numbered shift register unit among the shift register units SR(1), SR(2), ..., SR(2N−1) and SR(2N) is connected to a first clock line clk1, and the second clock signal terminal CLKB thereof is connected to a second clock line clk2; and the first clock signal terminal CLKA of an even-numbered shift register unit is connected to the second clock line clk2, and the second clock signal terminal CLKB thereof is connected to the first clock line clk1.

Figure 14:
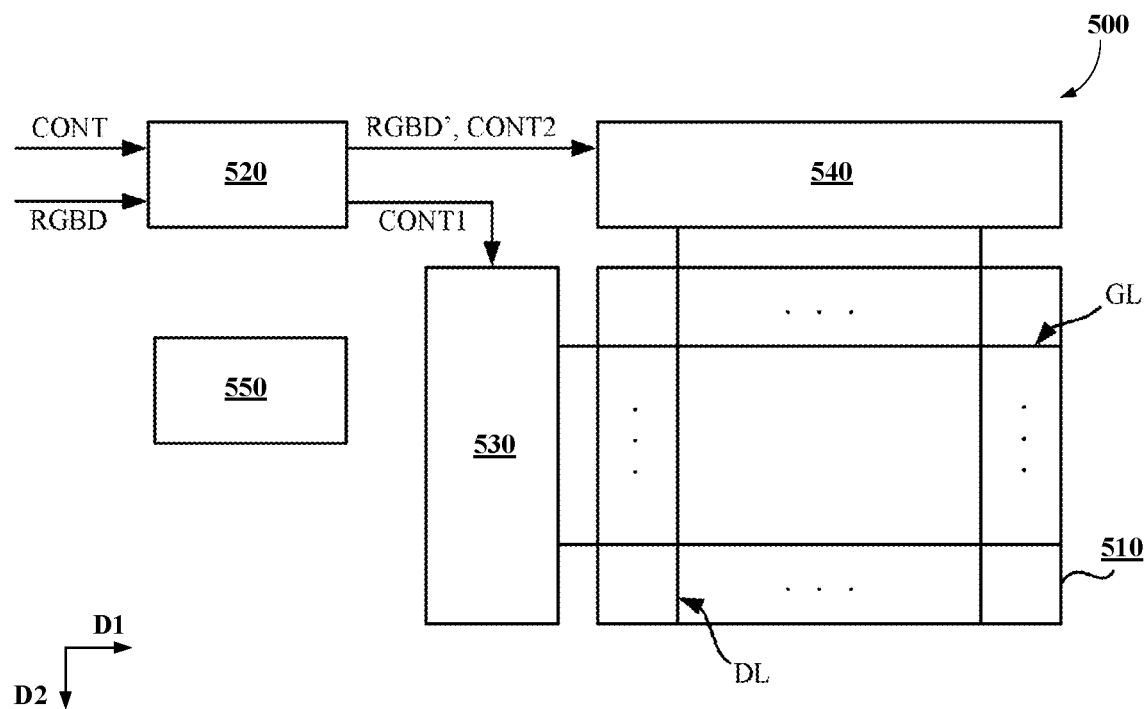
FIG. 14 is a schematic structure view of a display device according to an exemplary embodiment of this disclosure.

FIG. 14 is a schematic structure view of a display device 500 according to an exemplary embodiment of this disclosure. Referring to FIG. 14, the display device 500 comprises a display panel 510, a timing sequence controller 520, a gate driver 530, a data driver 540 and a voltage generator 550. The gate driver 530 can take the form of the gate driver 300 shown in FIG. 13. Besides, the first clock line clk1, the second clock line clk2, the first voltage line vgh and the second voltage line vgl shown in FIG. 13 are omitted in FIG. 14 for the convenience of illustration.

The display panel 510 is used for displaying received image data. The display panel 510 may have different types of structures, e.g., an add-on, an in-cell, an on-cell, an OGS and so on. The display panel 510 comprises a plurality of gate lines GL extending in a first direction D1 and a plurality of data lines DL extending in a second direction D2 intersecting the first direction D1 (e.g., substantially perpendicularly). The display panel of the display panel 510 comprises a plurality of pixels (not shown) arranged in the form of a matrix. Each of the pixels can be electrically connected to a corresponding one of the gate lines GL and a corresponding one of the data lines DL. The display panel of the display panel 510 can be a liquid crystal display panel, an organic light emitting diode (OLED) display panel or a display panel of any other suitable type.

The timing sequence controller 520 controls the operations of the display panel 510, the gate driver 530, the data driver 540 and the voltage generator 550. The timing sequence controller 520 receives from an external device (e.g., a host) input image data RGBD and an input control signal CONT. The input image data RGBD may comprise multiple input pixel data for the plurality of pixels. Each input pixel data may comprise a red grayscale datum R, a green grayscale datum G and a blue grayscale datum B for a corresponding one of the plurality of pixels. The input control signal CONT may comprise a main clock signal, a data enable signal, a vertical synchronization signal, a horizontal synchronization signal and so on. The timing sequence controller 520 generates output image data RGBD', a first control signal CONT1 and a second control signal CONT2 based on the input image data RGBD and the input control signal CONT. The implementation manner of the timing sequence controller 520 is known in the art. The timing sequence controller 520 may be implemented in various manners (e.g., by means of dedicated hardware) so as to execute different functions discussed herein. "Processor" is an example of the timing sequence controller 520 adopting one or more microprocessors, and the microprocessors can be programmed by using software (e.g., microcodes) so as to execute different functions discussed herein. The timing sequence controller 520 can be implemented with or without a processor, and it can also be implemented as a combination of dedicated hardware(s) for executing some functions and processor(s) for executing other functions. Examples of the timing sequence controller 520 comprise but are not limited to a conventional microprocessor, an application-specific integrated circuit (ASIC), and a field-programmable gate array (FPGA).

The gate driver 530 receives the first control signal CONT1 from the timing sequence controller 520. The first control signal CONT1 may comprise the first and the second clock line clock signals transmitted over the first and the second clock lines clk1 and clk2 shown in FIG. 7. The gate driver 530 generates based on the first control signal CONT1 a plurality of gate driving signals for outputting to the gate lines GL. The gate driver 530 can apply the plurality of gate driving signals to the gate lines GL sequentially.

The data driver 540 receives the second control signal CONT2 and the output image data RGBD' from the timing sequence controller 520. The data driver 940 generates a plurality of data voltages based on the second control signal CONT2 and the output image data RGBD'. The data driver 540 can apply the generated plurality of data voltages to the data lines DL.

The voltage generator 550 supplies electric power to the display panel 510, the timing sequence controller 520, the gate driver 530, the data driver 540, and potentially to further components. Specifically, the voltage generator 550 is configured to supply the first voltage line voltage and the second voltage line voltage transmitted respectively over the first voltage line vgh and the second voltage line vgl shown in FIG. 7 under the control of the timing sequence controller 520. The configuration of the voltage generator 550 may be known in the art. In one implementation, the voltage generator 550 can comprise a crossbar switch and a voltage converter such as a DC/DC converter. The voltage converter generates from an input voltage a plurality of output voltages having different voltage levels. Then, the crossbar switch can selectively couple these output voltages to the first voltage line vgh and the second voltage line vgl under the control of the timing sequence controller 520, so as to supply the first and second voltages as desired.

In each embodiment, the gate driver 530 and/or the data driver 540 may be arranged on the display panel 510, or connected to the touch display panel 510 by means of e.g. a tape carrier package (TCP). For example, the gate driver 530 may be integrated in the display panel 510 as a gate driver on array (GOA) circuit.

Examples of the display device 500 comprise but are not limited to a cell phone, a tablet computer, a television, a display, a notebook computer, a digital photo frame and a navigator.

Figure 15:
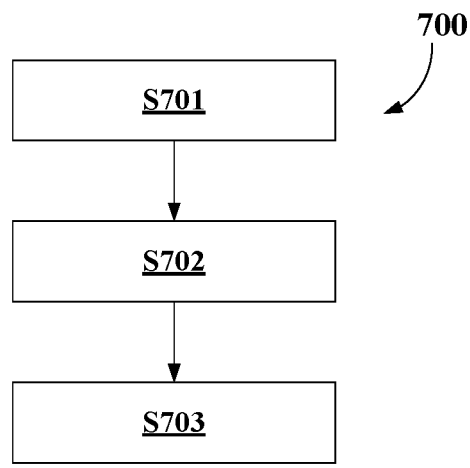
FIG. 15 is a flow chart of an exemplary method for driving the shift register unit according to an exemplary embodiment of this disclosure; Same or similar portions, parts and/or elements are indicated by same reference signs throughout the drawings.

Referring to FIG. 15, an exemplary method 700 for driving the shift register unit according to an exemplary embodiment of this disclosure is shown. It should be pointed out that steps in the method described below are all exemplary, and they do not have to be executed in the listed sequence, but instead one or more of the steps may be executed in different sequences or synchronously upon actual situations, and besides there may also be other additional steps upon actual situations.

The method 700 comprises the following steps:

Step S701: providing a first voltage to the first voltage terminal VGH, and providing a second voltage to the second voltage terminal VGL, wherein the first voltage is at an active potential and the second voltage is at an inactive potential;

Step S702: providing a first clock signal to the first clock signal terminal CLKA, and providing a second clock signal to the second clock signal terminal CLKB, wherein the first clock signal and the second clock signal have the same period and duty cycle, and differ from each other in timing sequence by half a period; and Step S703: providing an input pulse to the input terminal IN, wherein a pulse width of the input pulse is synchronized with a duration in which the first clock signal is inactive.

In an exemplary embodiment, the first clock signal received from the first clock signal terminal CLKA and the second clock signal received from the second clock signal terminal CLKB each have a duty cycle of 50%.

It should be noted that the shift register unit and the gate driver comprising the same according to the exemplary embodiments of this disclosure are both explained by taking a two phase clock signal as an example, but it can be easily understood that the shift register unit and the gate driver comprising the same according to the exemplary embodiments of this disclosure can also be implemented by using a four phase clock, a six phase clock or the like.

As discussed above, the shift register unit according to the exemplary embodiments of this disclosure can separate the output signal from the transfer signal by means of the output terminal OUT and the transfer terminal CR, which can reduce the sizes of the transistors connected to the output terminal OUT and the transfer terminal CR, thereby saving the layout area of the shift register unit and decreasing the power consumption thereof at the same time. Besides, the following problem can be avoided: the potential of the second node N2 is unstable due to abnormal leakage of charges at the first node N11 during the normal output of the shift register unit, which in turn leads to unstableness of the output signal of the shift register unit, or even failure of the shift register unit. Therefore, when the transistors forming the above shift register unit are all P-type transistors, the shift register unit is relatively more stable when there is a considerable process fluctuation or the PMOS device suffers a serious performance drift change in use.

What is discussed above is only specific embodiments of the present disclosure, but the protection scope of the present disclosure is not limited thereto. Any variation or substitution easily conceivable within the disclosure for a skilled person who is familiar with this technical field should fall within the protection scope of the present disclosure. Therefore, the protection scope of the present disclosure should be subject to the protection scopes of the claims.

What is claimed is:

1. A shift register unit, comprising:
   an input terminal, configured to receive an input pulse;
   a first voltage terminal, configured to be applied with a first voltage;
   a second voltage terminal, configured to be applied with a second voltage;
   a first clock signal terminal, configured to receive a first clock signal;
   a second clock signal terminal, configured to receive a second clock signal;
   an adjustment terminal, configured to receive an adjustment signal;
   an output terminal, configured to output an output signal;
   a transfer terminal, configured to output a transfer signal;
   an input circuit, configured to: in response to the first clock signal received at the first clock signal terminal being active, bring the input terminal, the adjustment terminal and a first node into conduction with each other, and in response to the first clock signal being inactive, disconnect the input terminal, the adjustment terminal and the first node from each other;
   a first control circuit, configured to: in response to a potential of a second node being at an active potential, bring the first voltage terminal into conduction with a third node, and in response to the first clock signal received at the first clock signal terminal being active, bring the second voltage terminal into conduction with the third node;
   an output circuit, configured to: in response to a potential of the second node being at an active potential, bring the second clock signal terminal into conduction with the output terminal and the transfer terminal, and in response to a potential of the third node being at an active potential, bring the first voltage terminal into conduction with the output terminal and the transfer terminal;
   wherein the first node is in conduction with the second node, wherein the adjustment signal reduces a voltage difference between the adjustment terminal and the first node when the input terminal, the adjustment terminal and the first node are disconnected from each other.

2. The shift register unit according to claim 1, wherein the input circuit comprises:
   a first transistor, comprising a control electrode connected to the first clock signal terminal, a first electrode connected to the first node, and a second electrode connected to the adjustment terminal; and
   a second transistor, comprising a control electrode connected to the first clock signal terminal, a first electrode connected to the adjustment terminal, and a second electrode connected to the input terminal.

3. The shift register unit according to claim 1, wherein the first control circuit comprises:
   a third transistor, comprising a control electrode connected to the first clock signal terminal, a first electrode connected to the third node, and a second electrode connected to the second voltage terminal; and
   a fourth transistor, comprising a control electrode connected to the second node, a first electrode connected to the third node, and a second electrode connected to the first voltage terminal.

4. The shift register unit according to claim 1, wherein the output circuit comprises:

a fifth transistor, comprising a control electrode connected to the second node, a first electrode connected to the transfer terminal, and a second electrode connected to the second clock signal terminal;

a sixth transistor, comprising a control electrode connected to the second node, a first electrode connected to the output terminal, and a second electrode connected to the second clock signal terminal;

a seventh transistor, comprising a control electrode connected to the third node, a first electrode connected to the first voltage terminal, and a second electrode connected to the output terminal;

an eighth transistor, comprising a control electrode connected to the third node, a first electrode connected to the first voltage terminal, and a second electrode connected to the transfer terminal.

5. The shift register unit according to claim 4, wherein the output circuit further comprises:
a first capacitor, comprising a first electrode connected to the control electrode of the sixth transistor, and a second electrode connected to the output terminal; and
a second capacitor, comprising a first electrode connected to the control electrode of the fifth transistor, and a second electrode connected to the transfer terminal.

6. The shift register unit according to claim 5, wherein the shift register unit further comprises a second control circuit, the second control circuit being configured to: in response to a potential of the first node being lower than the second voltage, disconnect the first node from the second node.

7. The shift register unit according to claim 6, wherein the second control circuit comprises an eleventh transistor, and wherein the eleventh transistor comprises a control electrode connected to the second voltage terminal, a first electrode connected to the first node, and a second electrode connected to the second node.

8. The shift register unit according to claim 4, wherein the output circuit further comprises:
a third capacitor, comprising a first electrode connected to the control electrode of the eighth transistor, and a second electrode connected to the first voltage terminal; and/or
a fourth capacitor, comprising a first electrode connected to the control electrode of the seventh transistor, and a second electrode connected to the first voltage terminal.

9. The shift register unit according to claim 1, wherein the shift register unit further comprises a first feedback circuit, the first feedback circuit being configured to: in response to the transfer signal of the transfer terminal being at an active potential, bring the output terminal into conduction with the adjustment terminal.

10. The shift register unit according to claim 9, wherein the first feedback circuit comprises a ninth transistor, and wherein the ninth transistor comprises a control electrode connected to the transfer terminal, a first electrode connected to the adjustment terminal, and a second electrode connected to the output terminal.

11. The shift register unit according to claim 1, wherein the shift register unit further comprises a first feedback circuit, the first feedback circuit being configured to: in response to the output signal of the output terminal being at an active potential, bring the transfer terminal into conduction with the adjustment terminal.

12. The shift register unit according to claim 11, wherein the first feedback circuit comprises a ninth transistor, and wherein the ninth transistor comprises a control electrode connected to the output terminal, a first electrode connected to the adjustment terminal, and a second electrode connected to the transfer terminal.

13. The shift register unit according to claim 1, wherein the shift register unit further comprises a second feedback circuit, the second feedback circuit being configured to: in response to a potential of the third node being at an active potential, bring at least one of the output terminal and the transfer terminal into conduction with the first node.

14. The shift register unit according to claim 13, wherein the first feedback circuit comprises a tenth transistor, and wherein the tenth transistor comprises a control electrode connected to the third node, a first electrode connected to at least one of the output terminal and the transfer terminal, and a second electrode connected to the first node.

15. A gate driver, comprising N cascaded shift register units according to claim 1, N being an integer greater than or equal to 2, wherein the transfer terminal of the (m)th shift register unit of the N shift register units is connected to the input terminal of the (m+1)th shift register unit of the N shift register units, wherein m is an integer and $1 \leq m < N$.

16. A display panel, comprising:
a first voltage line, configured to transmit a first voltage line voltage;
a second voltage line, configured to transmit a second voltage line voltage;
a first clock line, configured to transmit a first clock line clock signal;
a second clock line, configured to transmit a second clock line clock signal; and
the gate driver according to claim 15, wherein:
each first voltage terminal of the N shift register units is connected to the first voltage line,
each second voltage terminal of the N shift register units is connected to the second voltage line,
the first clock signal terminal of the (2k−1)th shift register unit of the N shift register units is connected to the first clock line, and the second clock signal terminal thereof is connected to the second clock line, and the first clock signal terminal of the (2k)th shift register unit of the N shift register units is connected to the second clock line, and the second clock signal terminal thereof is connected to the first clock line, and wherein k is a positive integer, and $2k \leq N$.

17. A display device, comprising:
the display panel according to claim 16;
a timing sequence controller, configured to control operations of the display panel, wherein the timing sequence controller is configured to at least supply the first clock line clock signal and the second clock line clock signal respectively to the first clock line and the second clock line, wherein the first clock line clock signal and the second clock line clock signal have a same period and duty cycle, and differ from each other in timing sequence by half the period;
a voltage generator, configured to at least supply the first voltage line voltage and the second voltage line voltage respectively to the first voltage line and the second voltage line, wherein the first voltage line voltage is at an active voltage level, and the second voltage line voltage is at an inactive voltage level.

18. The display device according to claim 17, wherein the first clock line clock signal and the second clock line clock signal each have a duty cycle of 50%.

19. A method for driving the shift register unit according to claim 1, comprising:

providing the first voltage to the first voltage terminal and providing the second voltage to the second voltage terminal, wherein the first voltage is at an active voltage level and the second voltage is at an inactive voltage level;

providing the first clock signal to the first clock signal terminal and providing the second clock signal to the second clock signal terminal, wherein the first clock signal and the second clock signal have a same period and duty cycle, and differ from each other in timing sequence by half the period; and providing the input pulse to the input terminal, a pulse width of the input pulse being synchronized with a duration in which the first clock signal is inactive.

20. The method according to claim 19, wherein the first clock signal and the second clock signal each have a duty cycle of 50%.

* * * * *